United States Patent [19]

Barnhart

[11] 4,205,303
[45] May 27, 1980

[54] PERFORMING ARITHMETIC USING INDIRECT DIGITAL-TO-ANALOG CONVERSION

[75] Inventor: Carl F. Barnhart, San Jose, Calif.

[73] Assignee: International Business Machines Corporation, Armonk, N.Y.

[21] Appl. No.: 892,244

[22] Filed: Mar. 31, 1978

[51] Int. Cl.² ........................................... H03K 13/02
[52] U.S. Cl. ........................ 340/347 DA; 340/347 M; 235/92 PE; 235/92 DM; 235/92 CC; 364/754; 364/761; 364/768
[58] Field of Search .................... 340/347 M, 347 DA; 364/757, 764, 784; 235/92 T, 92 TF, 92 PE, 92 DM, 92 CC

[56] References Cited

U.S. PATENT DOCUMENTS

| 3,052,412 | 9/1962 | Baskin | 364/757 |
| 3,424,980 | 1/1969 | Anderson | 364/764 |
| 3,447,149 | 5/1969 | Groth | 340/347 DA |
| 3,646,545 | 2/1972 | Naydan et al. | 340/347 NT |
| 3,786,488 | 1/1974 | Ahlgren | 340/347 DA |

Primary Examiner—Thomas J. Sloyan
Attorney, Agent, or Firm—Henry E. Otto, Jr.

[57] ABSTRACT

Circuitry and method for adding, subtracting, multiplying and/or dividing a plurality of multi-bit, arbitrarily signed, changeable, coded digital input signals representing numerical values to convert said signals into a single analog output signal of predetermined amplitude having a fixed period but a duty cycle that is proportional to the algebraic sum or product or quotient of said input signals. This is accomplished using indirect digital-to-analog conversion.

7 Claims, 7 Drawing Figures

PERFORMING ARITHMETIC USING INDIRECT DIGITAL-TO-ANALOG CONVERSION

BACKGROUND OF THE INVENTION

This invention relates to circuitry for converting digital signals to analog signals, and more particularly to circuitry for performing arithmetic addition, subtraction, multiplication and/or division concurrently with a change in representation of numerical values from a plurality of binary coded digital signals to a pair of binary signals representing the magnitude and sign, respectively, of what will hereinafter be referred to as a "ternary analog output signal," said magnitude signal having a fixed period but a varying duty cycle.

The representation of a number may be converted from a plurality of binary coded signals to a linear analog signal using either direct digital-to-analog conversion (DAC) or indirect DAC techniques. Direct DAC, which is the more common, employs a fixed reference voltage, and provides an output voltage that is a portion of said reference voltage and has a linear relationship with the number represented by changeable, binary coded inputs. Indirect DAC employs a binary signal with a fixed period, and provides a ternary analog output signal of said fixed period whose duty cycle (i.e., fraction of the period that said output signal is not zero) has a linear relationship with the number represented by changeable, binary coded inputs. Generally, an analog device that receives the indirect DAC output is not capable of responding to changes of the ternary analog signal within the period of the signal. Rather, it responds to the average of the signal over many periods (i.e., the average of the duty cycles over said periods).

DESCRIPTION OF THE PRIOR ART

U.S. Pat. No. 3,786,488 is not only prior art known to applicant which discloses a signal conversion circuit generating an output signal having analog characteristics that vary with the algebraic sum of numerical values represented by a plurality of changeable binary coded input signals. However, this circuit converts a digital signal to a frequency value, and it cannot handle digital numbers whose signs are not known in advance. In contrast, applicant's circuitry (hereinafter to be described) converts digital inputs into a signal of constant frequency and fixed period but with a duty cycle having a duration proportional to the digital inputs; and it can handle arbitrarily signed digital numbers.

U.S. Pat. No. 3,646,545 discloses the basic indirect DAC concept, implemented in a specific and different manner than that of the applicant. There is no circuitry for performing arithmetic functions.

U.S. Pat. No. 3,447,149 discloses a circuit for producing a constant frequency, variable duty cycle analog signal and employing two binary counters. The duty cycle is increased or decreased in response to a train of digital pulses; but it does not convert a multi-bit digital number and hence cannot perform arithmetic functions involving several multi-bit digital numbers.

SUMMARY OF THE INVENTION

The principal object of this invention is to provide an analog output signal of a predetermined amplitude and fixed period having a duty cycle proportional to the algebraic sum or product or quotient of a plurality of multi-bit, arbitrarily signed, changeable coded digital input signals, said input and output signals representing numerical values.

Another object is to provide a circuit of the above type wherein the arithmetic functions are performed concurrently with a change in representation of numerical values from a plurality of digital input signals to a binary coded ternary analog output signal having a fixed period and varying duty cycle.

According to these objects, the circuitry embodying the invention converts a plurality of multi-bit, arbitrarily signed, changeable, coded digital input signals into a single analog output signal of predetermined amplitude but a duty cycle related to said digital input signals. During algebraic addition, each input signal is loaded into a different one of a plurality of resettable counters. The counters are controlled in such manner as to cause all of the input signals to be counted sequentially if of identical algebraic signs; however, if any input signals are of non-identical algebraic signs, all positive input signals are counted sequentially and all negative input signals are counted sequentially with respect to each other but concurrently with the positive input signals. A pair of binary signals are generated representing the magnitude and the sign, respectively, of a ternary analog output signal, the average value of the magnitude varying substantially linearly with changes in algebraic sum of the numerical values represented by the input signals. For multiplication, the input signal representing the multiplier is fed into a register that provides binarily weighted outputs corresponding to the value of the multiplier; and the counter is driven at varying rates as determined by successive clock pulses as modified by the binarily weighted output, thereby to generate a ternary analog output signal having an average value that varies substantially linearly with the product of the numerical values represented by the input signals.

According to variations of the invention, a variable modulo counter loaded with one of the input signals provides, as an input to another counter, a series of multiplier pulses, one upon each completion of that number of clock pulses corresponding to the numerical value of said one input signal. Another of the input signals is loaded into said other counter. The other counter is enabled for a period of time corresponding to the product of the numerical value of said one and other signals, with the average value of the ternary analog output signal varying substantially linearly with changes in the product of the numerical values represented by said input signals. During multiplication, the other counter is loaded one out of every n clock pulses; and the multiplier pulses (rather than the n clock pulses) are counted by said other counter. For division, however, the components are rearranged such that said other counter will now be loaded only once every C·n clock pulses instead of every n clock pulses, where C represents the value of the input signals loaded into the modulo counter. As a result, the duration of the repeating period varies an an analog representation of C; and the duty cycle varies as an analog representation of the reciprocal of C.

The foregoing and other objects, features and advantages of the invention will become apparent from the following more detailed description of preferred embodiments thereof, as illustrated in the accompanying drawings.

DESCRIPTION OF PREFERRED EMBODIMENT

Figure 1:
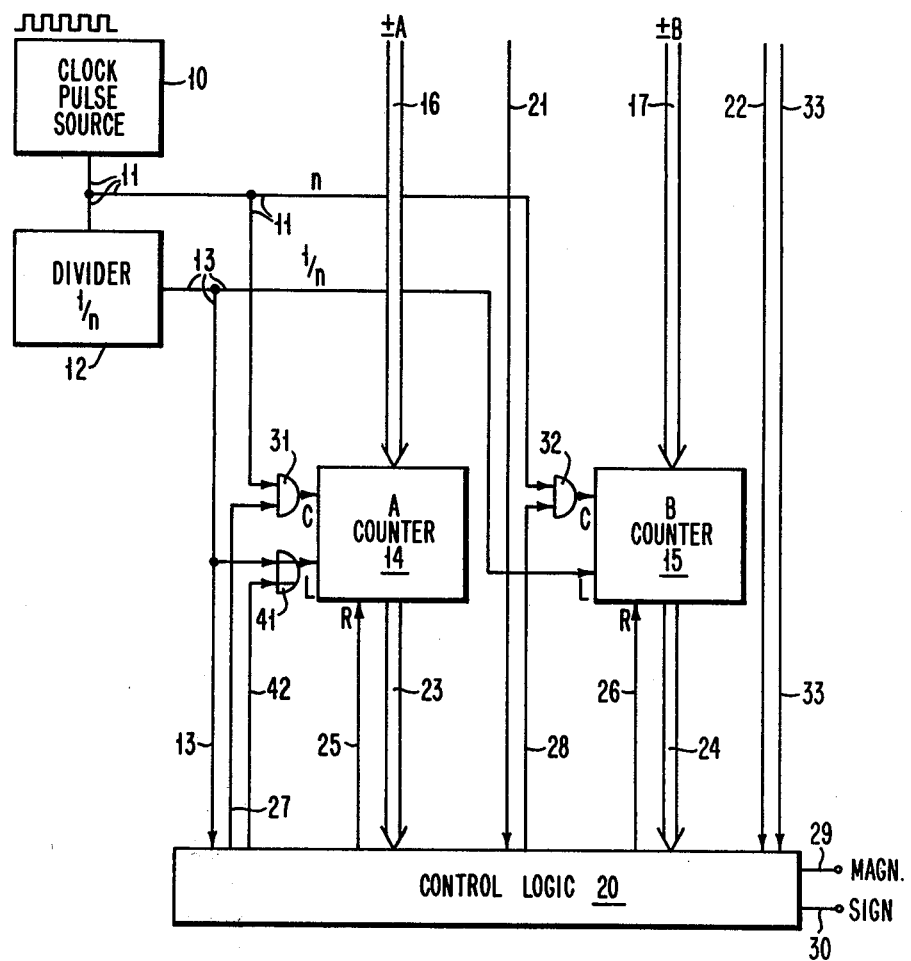
FIG. 1 is a circuit diagram depicting circuitry, according to the invention, for converting a plurality of multi-bit, arbitrarily signed, changeable, coded digital input signals, into a ternary output signal, the average value of which varies substantially linearly with changes in the algebraic sum of the numerical values represented by the input signals.

As illustrated in FIG. 1, the conversion circuitry embodying the invention provides a single analog output signal representing the algebraic sum of $\pm A \pm B$, where A and B are multi-bit, arbitrarily signed, changeable, binary coded input signals. This circuitry comprises a clock pulse generator 10 providing in line 11 a stream of synchronized clock pulses, preferably in the form of a high frequency square wave of constant period. A branch of line 11 is connected to a "divide by n" divider 12 that provides in line 13 a "start pulse" that is on for only one out of n (hereinafter 1/n) clock periods. An A counter 14 and B counter 15 receive via buses 16 and 17, respectively, multi-bit, arbitrarily signed, changeable, binary coded input signals representing numerical values A and B that are to be algebraically summed.

Control logic circuitry 20 (hereinbelow described in detail) has the following inputs: a line 21 carrying a signal the level of which represents the sign of the A multi-bit input signal in bus 16; a line 22 carrying a signal the level of which represents the sign of the B multi-bit input signal in bus 17; a branch of start pulse line 13; a bus 23 having a value representing the state of A counter 14; and a bus 24 having a value representing the state of B counter 15. Control logic circuitry 20 has the following outputs; reset lines 25, 26 to provide signals to reset the A and B counters 14 and 15, respectively; enable lines 27, 28 to provide signals to enable the A and B counters, respectively; and lines 29, 30 which carry signals representing the magnitude and sign, respectively, of the ternary analog output from the control logic circuitry.

AND gates 31, 32 logically AND the enable signals in lines 27 and 28, respectively, with the clock pulses in line 11. The outputs of AND gates 31, 32 become the pulse streams counted by the A and B counters 14 and 15, respectively.

(a) Addition of Multi-bit, Arbitrarily Signed, Changeable Numbers

For the sake of brevity in subsequent description, the statement that a "line is on (or off)" will be used as a shorthand expression for the fact that the "level of the signal in said line is up (or down)".

In operation, assume initially that two numbers represented by binary digital input signals are to be added. Prior to a start pulse 13, the A and B counters 14 and 15 are held reset by reset lines 25 and 26, respectively, being on; and counter enable lines 27 and 28 are off. The start pulse 13 causes A and B counters 14 and 15 to load the binary coded input signals 16 and 17, respectively. Start pulse 13 also causes control logic circuitry 20 to turn off reset lines 25 and 26.

Sign lines 21 and 22 will be on when the sign is plus; and will be off when the sign is minus. Accordingly, under the assumed condition, the signal levels in both the A sign line 21 and B sign line 22 will be the same. Hence, start pulse 13 will cause control logic circuitry 20 to turn on only the A counter enable line 27. Circuitry 20 will monitor the state of the A counter line 23 until the count equals a specific, fixed constant that represents count completion; e.g., the binary code for zero. In this case, the number of clock pulses that have occurred in the clock pulse line 11 following start pulse 13 will be numerically equal to the number represented by the binary coded signals 16 input to A counter. When circuitry 20 recognizes count completion in the A counter 14 (i.e., A counter decremented to zero), it will turn off A counter enable line 27 and turn on B counter enable line 28. Circuitry 20 will then monitor the state of the B counter line 24 until the B counter 15 decrements to zero, signifying count completion; whereupon, circuitry 20 will turn off the B counter enable line 28 and turn on the A and B counter reset lines 25 and 26.

Since the clock pulses in line 11 have a constant period, it will be noted that the length of time measured from start pulse 13 until control logic circuitry 20 recognizes completion of the count in A counter 14 (i.e., the duration of time that A counter enable line 27 is on) is an analog representation of the number represented by the binary coded input signals entered via bus 16 into the A counter. Similarly, the duration of time that B counter enable line 28 is on is an analog representation of the number represented by the binary coded input signals entered via bus 17 into B counter 15. Hence, the length of time measured from start pulse 13 to completion of the count in B counter 15 is an analog representation of the number equal to the sum of the numbers represented by the binary coded inputs 16 and 17, as will be understood from FIG. 6A and subsequent description in Section entitled "Timing Diagrams."

As earlier noted, circuitry 20 generates an output signal in line 29 representing the magnitude of the analog output, and an output signal in line 30 representing the sign of said output. As shown in Table I below, magnitude signal 29 is on whenever either A counter enable 27 or B counter enable 28 is on, but both are not on. The sign signal 30 is set to the value of A sign 21 when only the A counter enable signal 27 is on, and to the value of the B sign 22 when only the B counter enable signal 28 is on. At other times (when magnitude signal 29 is off), sign signal 30 is held at its last value. In the example illustratively assumed above, wherein the signs of both A and B sign lines 21 and 22 are the same, the magnitude signal 29 would be on for a time representing the addition of the numbers represented by the binary coded signals 16 and 17.

TABLE I

| 27 $A_{en}$ | 28 $B_{en}$ | 29 MAGN | 30 SIGN |
|---|---|---|---|
| 0 | 0 | 0 | * |
| 0 | 1 | 1 | B |
| 1 | 0 | 1 | A |
| 1 | 1 | 0 | * |

*last value is held

TABLE II

| 29 MAGN | 30 SIGN | ANALOG VALUE |
|---|---|---|
| 0 | 0 | 0 |
| 0 | 1 | 0 |
| 1 | 0 | +1 |
| 1 | 1 | −1 |

This sequence is repeated every time that start pulse 13 occurs (i.e., once every n clock periods). This duration, n clock periods, represents the maximum possible result of an addition. Any result larger than the length of time between successive start pulses 13 would cause the magnitude signal 29 to be on all the time; i.e., to saturate. Also, because the sequence is repeated upon every start pulse 13, the magnitude signal 29 becomes a square wave with a constant period. As the binary coded inputs 16 and 17 to A and B counters 14 and 15 vary, so does the duration of the magnitude signal in 29 in each period. The result is a signal whose duty cycle (percentage of time on) varies in a linear relationship with the sum of the numbers represented by the binary coded inputs 16 and 17, provided saturation is not permitted to occur.

Analog circuits (not shown) would normally be designed to respond to the average or direct current value of the magnitude signal in line 29, with polarity being altered in accordance with the sign signal in line 30.

(b) Subtraction of Multi-bit, Arbitrarily Signed, Changeable Numbers

Assume now that two binary coded digital numbers are to be subtracted; i.e., the A sign in line 21 is not the same as the B sign in line 22. Start pulse 13 causes control logic circuitry 20 to turn on both the A and B counter enable lines 27 and 28. As shown in Table I, magnitude signal 29 will then be off. Control logic circuitry 20 will monitor both the state lines 23 and 24 until the counts therein equal the illustratively assumed binary zero indicating count completion. When the count in either counter 14 or 15 reaches completion, its respective counter enable signal 27 or 28 is turned off; whereupon, with only one counter enable signal on, the magnitude signal 29 and sign signal 30 will be set in accordance with Table I. In this example, magnitude signal 29 will be on for a length of time representing the difference between the numbers represented by the binary coded inputs 16 and 17 to A and B counters 14 and 15, respectively, as will be understood from FIG. 6B and description in Section entitled "Timing Diagrams." Sign signal 30 will be set to the sign of the larger of the numbers represented by the inputs 16 and 17.

It will thus be seen that the circuitry as thus far described produces an analog output with an average or direct current value representing the algebraic sum of two arbitrarily signed, changeable, binary coded inputs.

(c) Addition/Subtraction of a Constant Number

B counter 15 and control logic circuitry 20 can also be used to algebraically sum a constant of arbitrary sign; i.e., B±D, where D represents a constant whose magnitude is known to always be smaller than the magnitude of the number represented by the signals in B input bus 17. Control logic circuitry 20 monitors a D input sign line 33 as well as the B input sign line 22. Circuitry 20 will select one or the other of two count termination conditions. If the signs of B and D in 22 and 23 are the same, then count termination is selected to occur when the number of pulses delivered to clock pulse line 11 while B counter enable line is on becomes numerically equal to the number represented by the signals in the B input bus 17 plus the constant D. If the signs in 22 and 33 differ, then count termination is selected to occur when the number of pulses delivered to clock pulse line 11 becomes numerically equal to the number represented by the signals in B input bus 17 minus the constant D. Because of the constant period of the clock pulses n, the length of time that B counter enable line 28 is on is an analog representation of the algebraic sum of the number represented by the signals in B input bus 17 and the constant D.

(d) Multiplication

Figure 2:
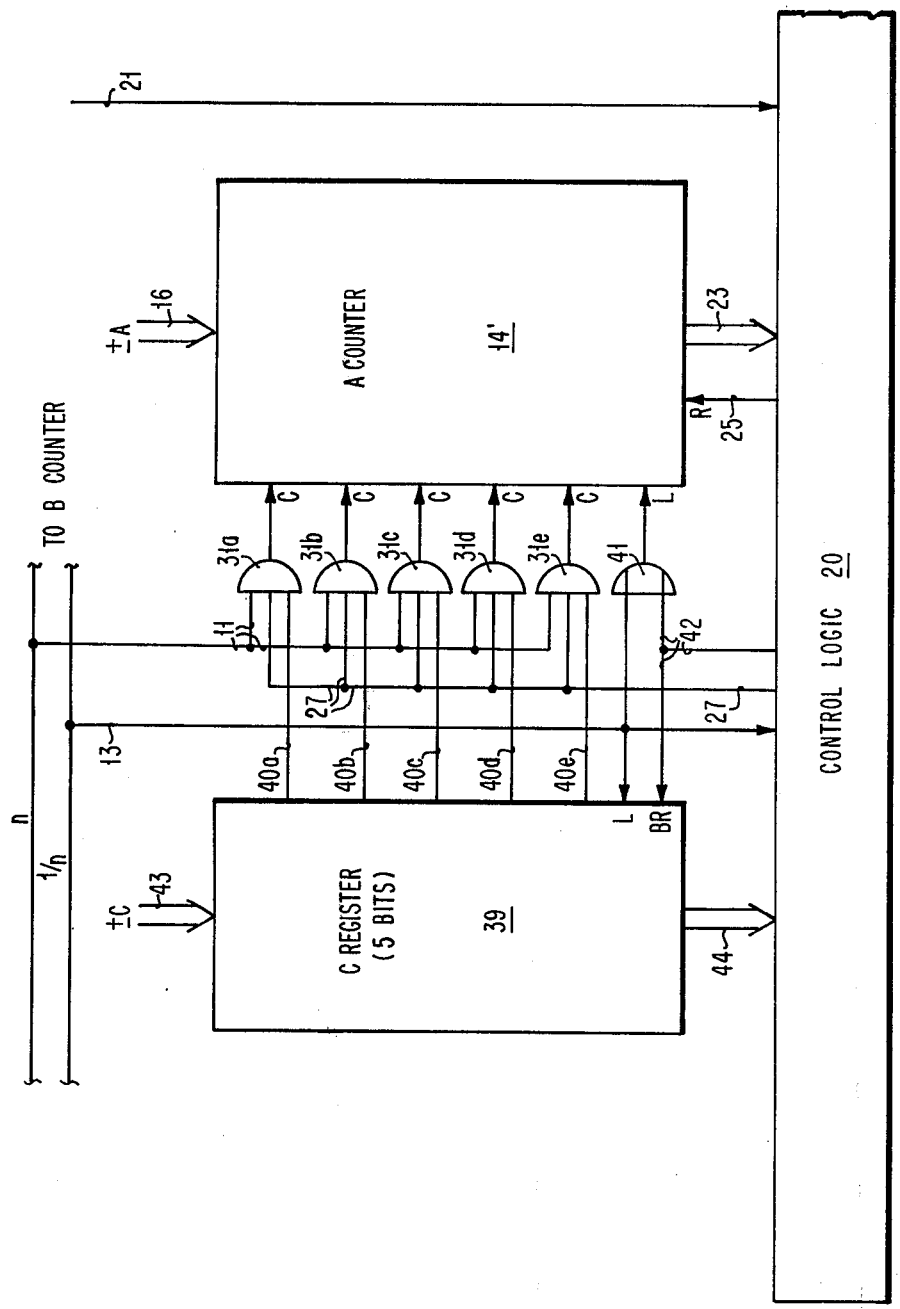
FIG. 2 is a circuit diagram depicting how the circuitry is modified to provide a ternary output signal that varies substantially linearly with changes in the product of the numerical values represented by the changeable input signals.

Assume now that two binary coded numbers, A and C, are to be multiplied to produce an analog signal corresponding to their product. This may be achieved by the circuitry illustrated in FIG. 2, in which like reference numerals are used to denote elements that are similar to those described in connection with FIG. 1. The circuitry of FIG. 2 comprises modified A counter 14′, preferably implemented as a programmable logic array (PLA). AND gate 31 is replaced with five AND gates 31a–e, each having as common inputs branches of clock pulse line 11 and A counter enable line 27; however, these gates have respective third inputs 40a–e, that constitute binarily weighted outputs from a C register 39.

The A counter 14′, as modified, will count by ones, twos, fours, eights or sixteens depending upon whether the clock pulses from line 11 pass through AND gate 31a,b,c,d or e, respectively. Since the seven-bit A counter 14′ has a maximum of 128 states, the number of clock pulses necessary to reach count completion will be 128, 64, 32, 16 or 8, respectively, depending upon which AND gate 31a,b,c,d or e is selectively enabled. Table III below shows how C register 39 controls which input 40a–e is on, and hence which particular AND gate 31a–e is selectively enabled. An OR gate 41 is enabled when either start pulse line 13 or an A counter load line 42 comes on, for thereby causing the A counter 14′ to load its binary coded input signals from bus 16.

TABLE III

| C REG. STATE (44) | COUNT SELECTION LINE | COUNT BY |
|---|---|---|
| 1xxxx | 40a | 1 |
| 01xxx | 40b | 2 |
| 001xx | 40c | 4 |
| 0001x | 40d | 8 |
| 00001 | 40e | 16 |
| 00000 | None | — | x = don't care

In operation, a start pulse in line 13 will cause the C register 39 to be loaded with the digital binary coded input signals from a bus 43. In addition to the functions already described in connection with addition and subtraction, control logic circuitry 20 will monitor via a bus 44 the state of C register 39. When control logic circuitry 20 senses count completion in A counter 14', it will no longer turn off the A counter enable line 27, but instead will provide a short on pulse in A counter load line 42. This pulse in line 42 will pass through OR gate 41 and cause A counter 14' to be loaded with its binary coded input signals from bus 16. This pulse in line 42 will also cause C register 39 to turn off the highest order bit that is then on, as denoted by the condition of the C register state bus 44. As noted from Table III, count select line 40b,c,d or e (in that sequence according to which now has a "1" bit) will be turned on; whereupon the A counter 14' will resume counting, but this time by a correspondingly higher number (2,4,8 or 16, as the case may be). Finally, when the C register state bus 44 no longer has a "1" in any of its bit positions, the multiplication operation will have been completed; and the A counter enable signal in 27 will turn off.

By way of example, assume that the binary coded input signals in bus 43 are set to 10100, in that order, where "1" represents the "on" state. When loading is initiated by a start pulse in line 13, count select line 40a will turn on and cause the A counter 14' to count by ones. When the A counter 14' decrements to zero, indicating completion of the count by ones, control logic circuitry 20 will provide a pulse in line 42. This will cause A counter 14' to again load its binary coded input signals from bus 16 and concurrently cause C register 39 to turn off the highest order bit that is then in its "on" state. The C register state in bus 44 will now be 00100, with the result that count select line 40c will turn on and cause A counter 14' to count by fours. After the control logic circuitry 20 again decrements to zero and thus recognizes count completion, it will provide a pulse in line 42; whereupon C register 39 will turn off the highest order bit that is then on in the C register state bus 44. The value in bus 44 will now become 00000. Since there are now no on bits (i.e., no "1's") in bus 44, the control logic circuitry 20 will turn off the A counter enable line 27.

It will thus be noted that, in this example, the A counter enable line 27 was on for a time duration that is the analog representation of the sum of the number represented by the binary coded signals in input bus 16 and one-quarter of that number (i.e., the number multiplied by 1.25, with any remainder being truncated.) The binary coded representation of 1.25 is 1.0100, which is the value assumed for the binary coded input signals in bus 43, a binary point being between the high order and next high order bits.

(e) Multiplication/Division—Alternate Embodiment

Figure 3:
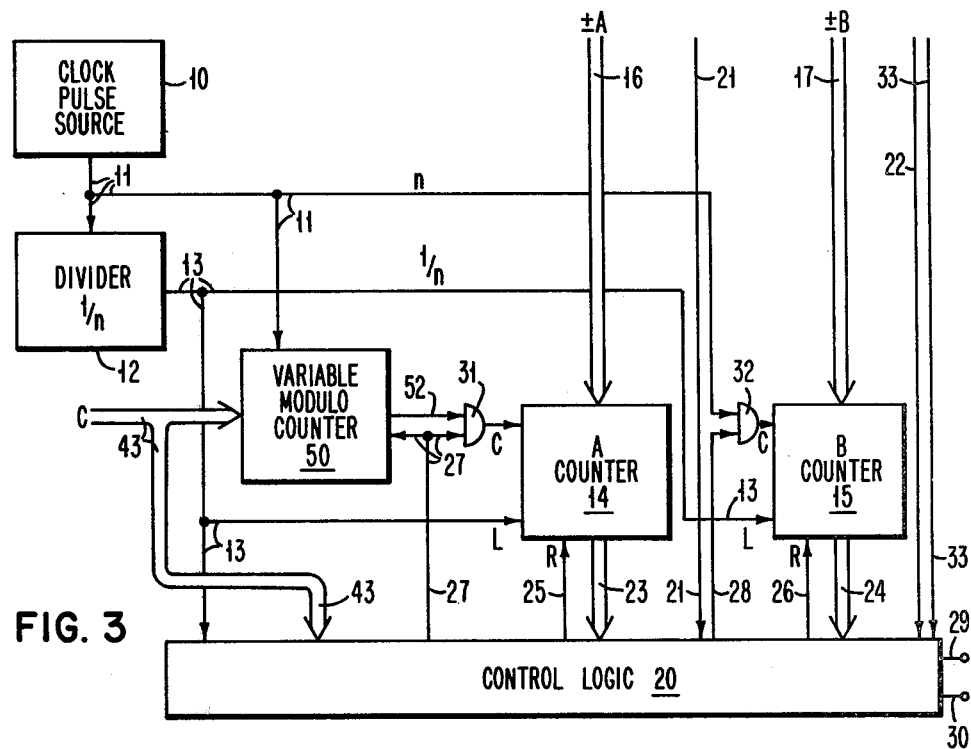
FIG. 3 and FIG. 4 are circuit diagrams according to variations of the invention for providing ternary output signals that vary substantially linearly with changes in the product of the numerical values represented by said input signals or by the quotient of the numerical values represented by said input signals.

An alternative and simpler embodiment to provide an analog representation of the product of two binary coded numbers is illustrated in FIG. 3. This embodiment may be used where truncation of the remainder is not desired or required. In FIG. 3, like reference numerals are used to denote elements that are similar to those described in connection with FIG. 1. This embodiment of FIG. 3 differs from that in FIG. 1 in the following respects:

Binary encoded number C, representing the multiplier, is loaded via input bus 43 into a variable modulo counter 50 that also receives an input from clock pulse line 11. The clock pulse line 11 is disconnected from AND gate 31 and a multiplier pulse line 52 is connected in its place. Counter 50 outputs to line 52 a single pulse every C clock pulses in line 11. These pulses in line 52 are counted in A counter 14 while A counter enable line 27 is on. The A counter enable line 27 will thus be on for C times A clock pulses, providing an analog representation of the product C.A.

Note that both C and A are integers and there is no truncation in this embodiment. Note also that the control logic circuitry 20 must monitor the C input bus 43. If or when the value in C input bus 43 is or becomes zero, then no multiplication will occur; and the A counter enable line 27 will turn off.

Figure 4:
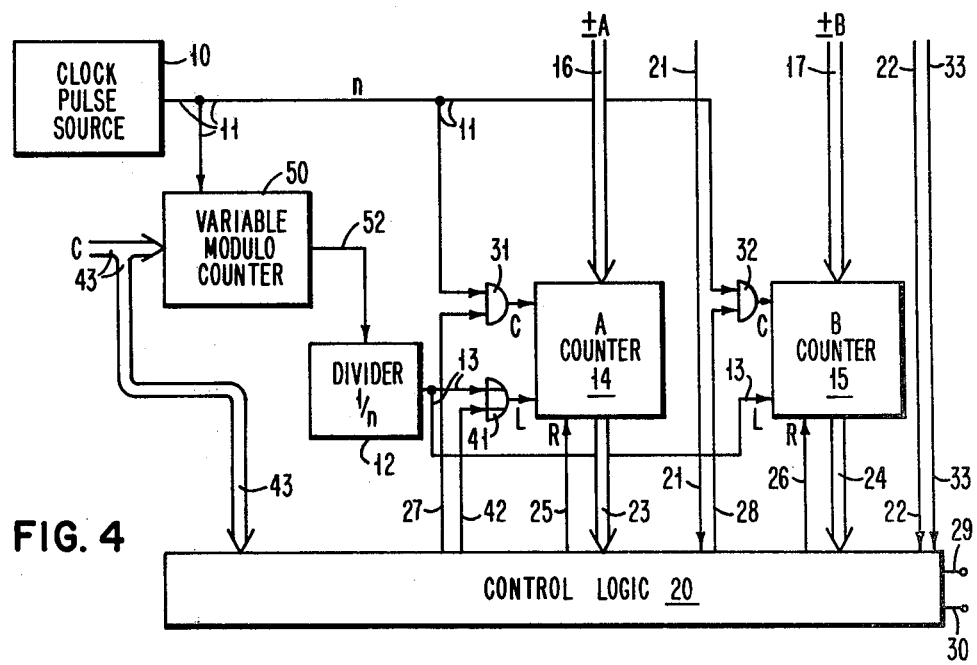

According to a variation of the invention, and as illustrated in FIG. 4, by relocating the divider 12, division (instead of multiplication) can be performed. The output of variable modulo counter 50 is now the input to divider 12. The output of divider 12 is still the start pulse line 13. Hence, the start pulse from line 13 to the A and B counters 14 and 15 will now occur only once every C.n clock pulses instead of once every n clock pulses. As a result, the duration of the repeating period varies as an analog representation of C; and the duty cycle (or average value) of the magnitude signal in 29 varies as an analog representation of the inverse of C.

(f) Control Logic Circuitry

Figure 5:
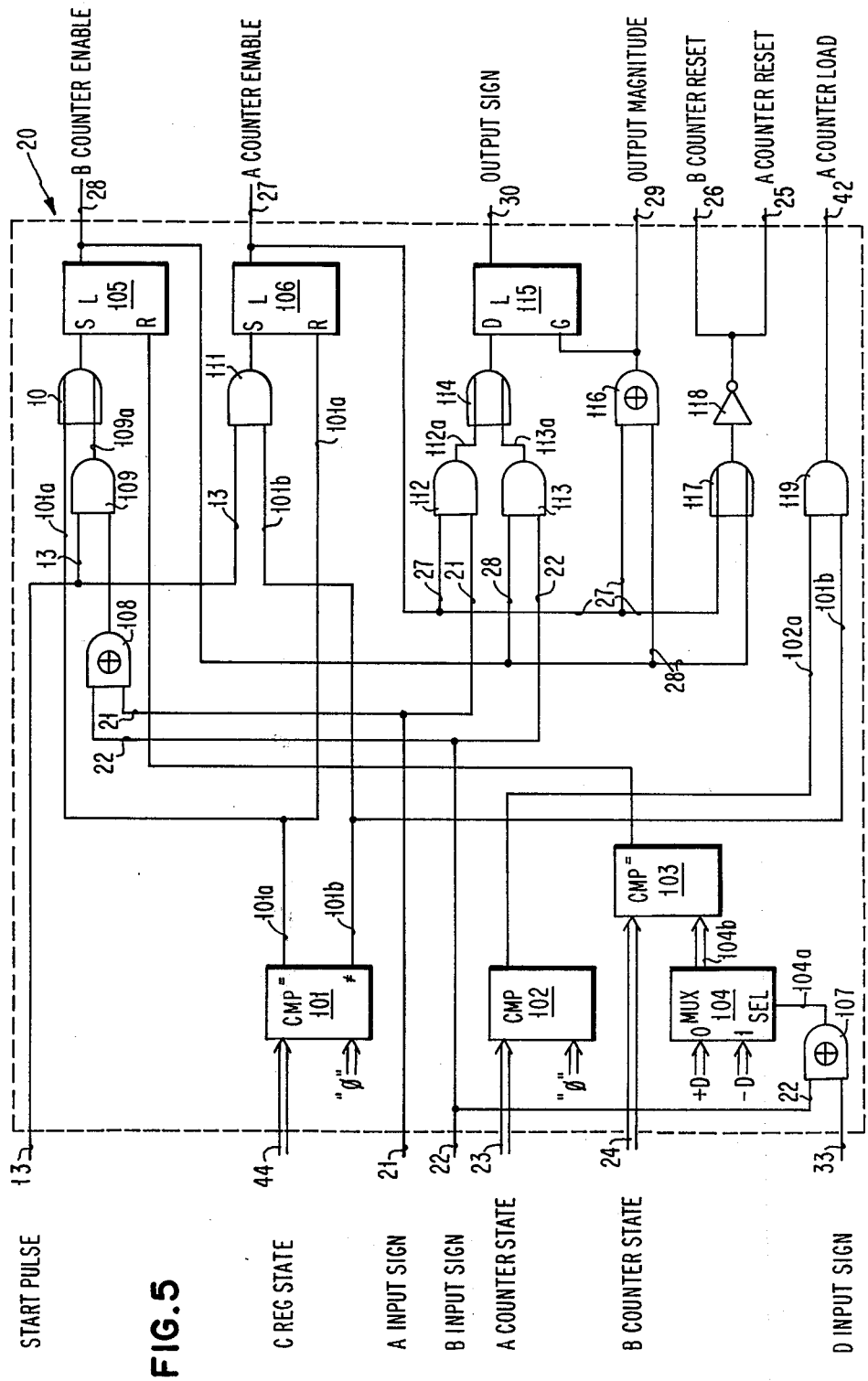
FIG. 5 is a detailed circuit diagram of the control logic portion of said circuitry.

As illustrated in FIG. 5, control logic circuitry 20 comprises conventional compare circuits 101, 102 and 103, each operative to compare two multi-bit binary numbers and provide a high level signal in respective output lines 101a, 102a or 103a, respectively, when the compared numbers are equal. A high level output will be provided by compare circuit 101 in a line 101b when the compared numbers are unequal. A conventional multiplexer 104 comprises circuitry for providing in an output line 104b either the multi-bit binary input from input port −D or from port +D, depending upon whether the signal in a single control input line 104a is respectively up or down. Note that D is the constant number described in connection with Section (c) above; it is internally stored in logic circuitry 20 and its sign, positive or negative, is indicated by the signal level in D input sign line 33. Latches 105 and 106 each have set and reset ports S and R; each such latch is operative when S is at a high level to provide an output at a high level until R becomes high level.

The control logic circuitry 20 further includes an exclusive OR gate 107 connected to branches of the B and D input sign lines 22 and 33, respectively, for providing in line 104a a high level signal if the signs in these lines are unequal and thus indicate the need to subtract. Similarly, another exclusive OR gate 108 provides a high level signal in a line 108a if the signs in the A and B input sign lines 21 and 22 are unequal and thus indicate the need to subtract. If start pulse line 13 comes up while line 108a is up, an AND gate 109 provides a high level signal in a line 109a which is passed by an OR gate 110 to set the B counter enable latch 105. If line 101b is up when start pulse line 13 comes up, an AND gate 111 will pass a signal to set A counter enable latch 106. If and when line 101a is up (indicating that any multiplication of A and C is complete), the OR gate 110 will pass the signal to set the B counter enable latch 105.

An AND gate 112 will provide an output to a line 112a when its two input lines 27 and 21 are up. An AND gate 113 will provide an output to a line 113a, when its two input lines 22 and 28 are up. An OR gate 114 will provide an output to data input port D of an output sign latch 115 if either line 112a or 113a is up. Latch 115 also has a gate input port G connected to a branch of magnitude line 29. While magnitude line 29 is at a high level, the output sign line 30 will have the same level as the data input port D; but when input gate port G is at a low level, the output sign line 30 will hold at its previous level. An exclusive OR gate 116 will provide an input to magnitude line 29 when either but not both of the A and B counter enable lines 27 and 28 are up. If either line 27 or 28 is up, however, an OR gate 117 will provide an output to an inverter 118, whose output is common to the A and B counter reset lines 25 and 26; hence, the A and B counters 14 and 15 will be reset only after both counters have decremented to zero (or the internally stored constant +D or −D). Finally, if both lines 101b and 102a are up, an AND gate 119 will bring up A counter load line 42.

In operation, assume that a start pulse comes up in line 13 while the value in the C register state bus 44 is not zero. Under the assumed condition, since line 101b will be up, A counter enable latch 106 will be set via gate 111 and bring up A counter enable line 27. If the A and B input sign lines 21 and 22 are not equal, B counter enable latch 105 will also be set via gates 108, 109, and 110; whereas if the A and B input sign lines 21 and 22 are equal, the B counter enable latch 105 will not be set until the value in the C register state bus 44 equals zero.

The A counter enable latch 106 will be reset when the value in the C register state bus 44 equals zero. The B counter enable latch 105 will be reset via circuit 103 and line 103a when the value in the B counter state bus 24 equals the output in line 104b from the multiplexer 104. If the B input sign in line 22 is equal to the D input sign in line 33, then the output in line 104b will be equal to +D; otherwise it will equal −D.

The A counter load line 42 will come up when the value in C register state bus 44 is not equal to zero, and the value in A counter state bus 23 equals zero. Line 42 enables multiplication by reloading the A counter input 16 into A counter 14 for repeated decrementing. For multiplication, A counter enable line 27 is not turned off until A counter state bus 23 and C register state 44 are both zero. Because of inverter 118, the A and B counter reset lines 25 and 26 will turn on when neither the A nor B counter enable line 27 or 28 is on.

Whenever A counter enable line 27 is not at the same logic level as the B counter enable line 28, the output magnitude line 29 will assume a high level. The signal in line 29 gates the output sign latch 115. If A counter enable line 27 is up, the sign in A input sign line 21 will be input via gates 112, 114 to data port D in output sign latch 115 and cause said latch to provide that sign in output sign line 30; whereas if B counter enable line 28 is up, the sign in B input sign line 22 will be provided in line 30 via the data port D and output sign latch 115.

(g) Timing Diagrams

The signals that control the A and B counters 14 and 15 and assumed to be the same. However, in FIG. 6A, the input signs in lines 21, 22 and 33 for the values of A, B and D, respectively, are positive; whereas in FIG. 6B, the A and D input signs in lines 21 and 33 are negative but the B input sign in line 22 is positive. Note that in output sign line 30, the signal level is low to denote a positive sign and is high to denote a negative sign.

Figure 6A:
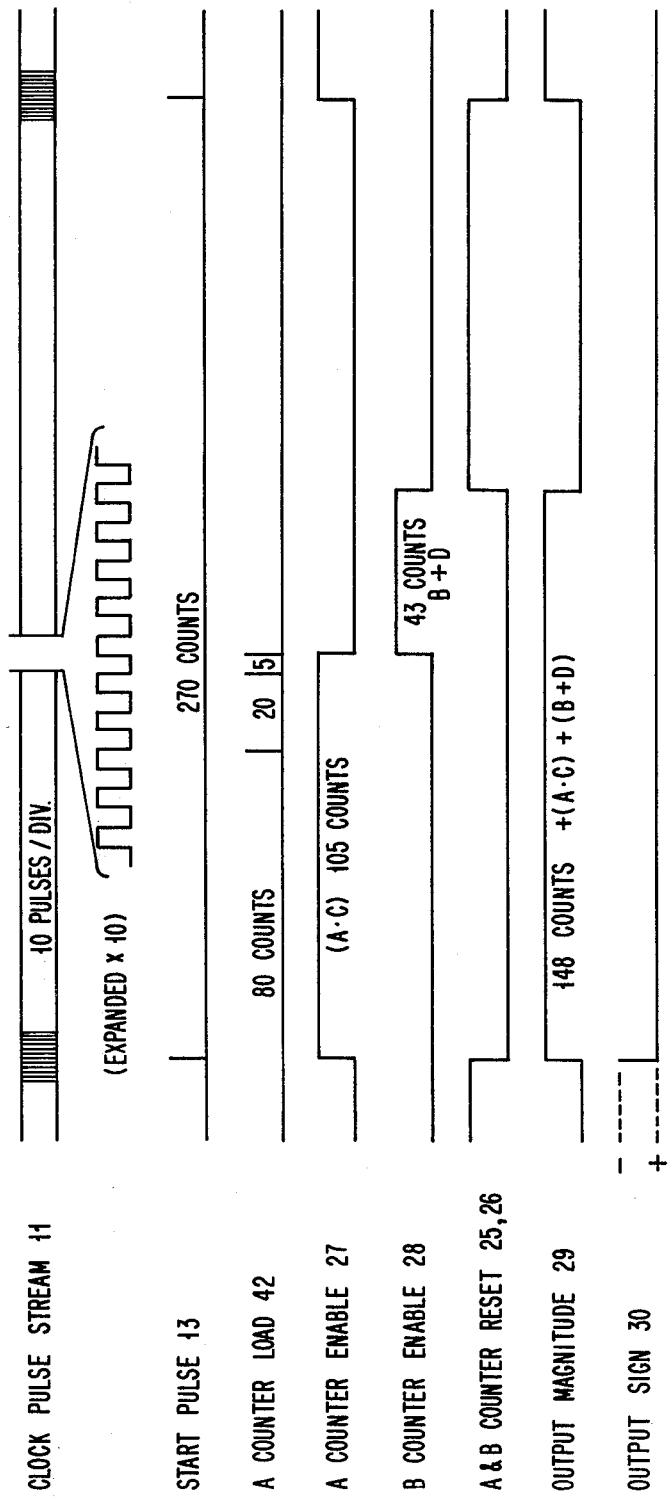
FIGS. 6A and B are timing diagrams depicting operation during an addition and a substraction operation, respectively.

By way of illustration, FIG. 6A depicts the signals during the following arithmetic operation:

$$+(A \cdot C)+(B+D),$$

where
 A = 1010000 (binary encoded 80)
 B = 100101 (binary encoded 37)
 C = 10101 (binary encoded 1.3125)
 D = 110 (binary encoded 6), a constant
Thus,
 $+(A \cdot C)+(B+D)=(80\times 1.3125)+(37+6)=105+43=148$. This duty cycle pattern will repeat until either A, B or C changes value.

Figure 6B:
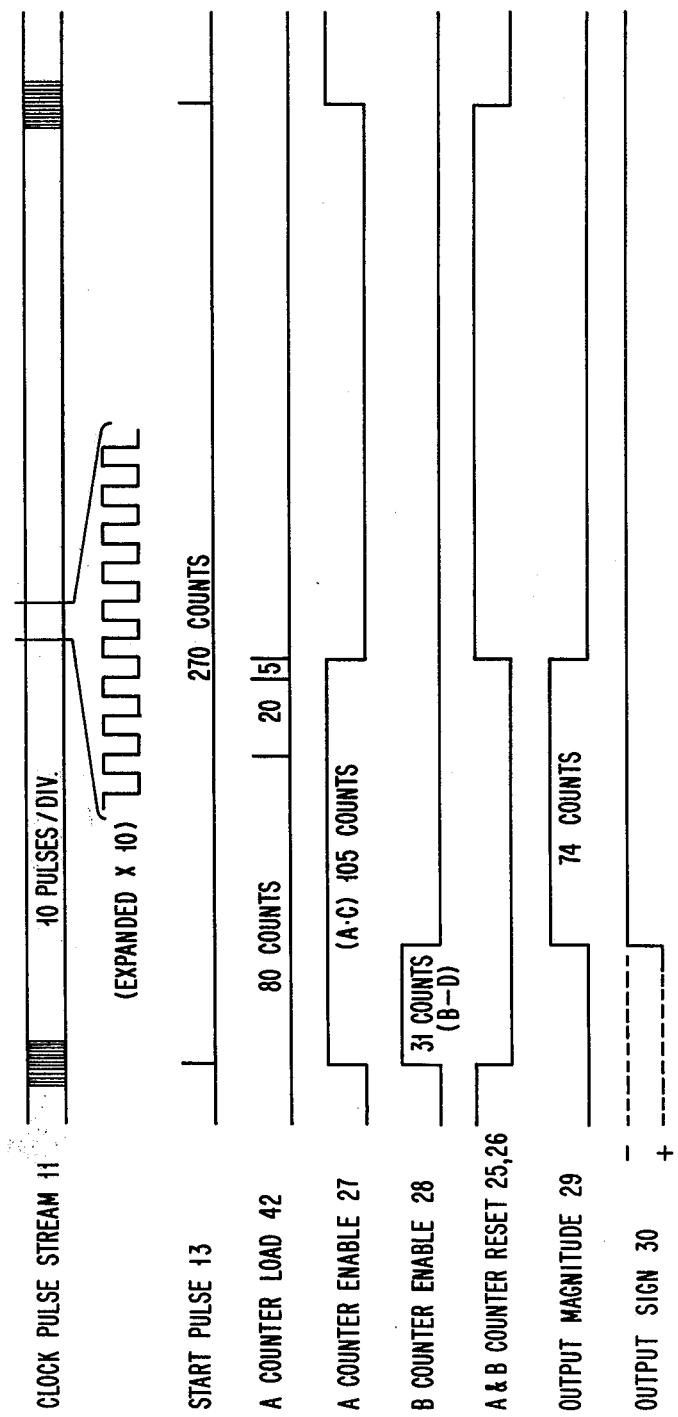

On the other hand, FIG. 6B depicts the signals during the following subtraction operation:

$$(-A\cdot C)+(B-D),$$

where A, B, C and D have the same values as above stated in connection with FIG. 6A.
Thus $(-A\cdot C)+(B-D)=(-80\times 1.3125)+(37-6)=-105+31=-74$.

While the invention has been particularly shown and described with reference to preferred embodiments thereof, it will be understood by those skilled in the art that various changes in form and detail may be made therein without departing from the spirit, scope and teaching of the invention. Accordingly, the apparatus herein disclosed is to be considered merely as illustrative, and the invention is to be limited only as specified in the claims.

I claim:

1. Circuitry for converting a plurality of multi-bit, arbitrarily signed, coded digital input signals into a single analog output signal of predetermined amplitude but a duty cycle related to said digital input signals, said circuitry comprising, in combination:
 a source of clock pulses;
 divider means for providing a start pulse one out of every n clock pulses;
 a pair of presettable counters, each operative while the respective counter is enabled by an enabling signal to count in a predetermined direction and at a rate determined by successive clock pulses from any numerical value set therein to a predetermined base value indicative of a count termination state;
 means for setting the numerical value of each input signal into a respective one of said counters responsively to a start pulse;
 means denoting whether the sign of each input signal is positive or negative; and
 means for providing an enabling signal to each counter successively if the signs of both input signals are identical and concurrently if the signs of the input signals are different, thereby to generate a pair of binary signals representing the magnitude and sign, respectively, of a ternary analog output signal, the average value of which varies substantially linearly with changes in algebraic sum of the numerical values represented by said input signals and said predetermined base value.

2. Circuitry according to claim 1, wherein the last-introduced means provides one input signal having a constant numerical value differing by a fixed count from said predetermined base value, to thereby cause the average value of said ternary output signal to vary substantially linearly with the algebraic sum of the numbers represented by said input signals and said fixed count.

3. Circuitry for converting a plurality of multi-bit, arbitrarily signed, coded digital input signals into a single analog output signal of predetermined amplitude but a duty cycle related to said digital input signals, said circuitry comprising, in combination:

a source of clock pulses;

divider means for providing a start pulse one out of every n clock pulses;

a presettable counter operable to count in a predetermined direction from any numerical value set therein to a predetermined base value indicative of a count termination state;

means for setting the numerical value of one of the input signals into said counter responsively to a start pulse;

presettable means providing binarily weighted outputs corresponding to the binary value of another of the input signals; and means for driving said counter at varying rates as determined by successive clock pulses as modified by said binarily weighted outputs, thereby to generate a pair of binary signals representing the magnitude and sign, respectively, of a ternary analog output signal, the average value of which varies substantially linearly with the product of the numerical values represented by said input signals.

4. Circuitry according to claim 3, wherein said means for driving includes a plurality of AND gates, each including common inputs coupled to said pulse source and respective different inputs each responsive to a different order bit of the binary value of said other input signals, such that each of said gates with an active bit will be activated in sequence by successive start pulses, to cause said counter to count by a correspondingly different binary order of magnitude until no active bits remain and the multiplication operation is thus completed.

5. Circuitry for converting a plurality of multi-bit, arbitrarily signed, changeable, coded digital input signals into a single analog output signal of predetermined amplitude but a duty cycle related to said digital input signals, said circuitry comprising, in combination:

a plurality of presettable counters, driven to count at predetermined rates from numerical values set therein;

means denoting whether the sign of each input signal is positive or negative;

means for loading and enabling said counters to (a) cause all said input signals to be counted sequentially if of identical algebraic signs, but (b) if any input signals are of non-identical algebraic signs, cause all input signals with a positive algebraic sign to be counted sequentially and all input signals with a negative algebraic sign to be counted sequentially with respect to each other and concurrently with those of positive algebraic sign; and means for generating a pair of binary signals representing the magnitude and sign, respectively, of a ternary analog output signal, the average value of which varies substantially linearly with changes in algebraic sum of the numerical values represented by said input signals.

6. Circuitry for converting a plurality of multi-bit, arbitrarily signed, coded digital input signals into a single analog output signal of predetermined amplitude but a duty cycle related to said digital input signals, said circuitry comprising, in combination:

a source of clock pulses;

divider means for providing a start pulse one out of every n clock pulses;

a presettable counter operative while the respective counter is enabled by an enabling signal to count in a predetermined direction and at a rate determined by successive clock pulses from any numerical value set therein to a value indicative of a count termination state;

means for setting the numerical value of one of said input signals into said counter responsively to a start pulse;

a variable modulo counter loaded with another of said input signals for providing, as an input to the first-named counter while it is enabled, a series of multiplier pulses, one upon each completion of that number of clock pulses corresponding to the numerical value of said other input signal; and means for providing an enabling signal to the first-named counter for a period of time corresponding to the product of the numerical value of said one and other signals, thereby to generate a pair of binary signals representing the magnitude and sign, respectively, of a ternary analog output signal, the average value of which varies substantially linearly with changes in the product of the numerical values represented by said input signals.

7. Circuitry for converting a plurality of multi-bit, arbitrarily signed, coded digital input signals into a single analog output signal of predetermined amplitude but a duty cycle related to said digital input signals, said circuitry comprising, in combination:

a source of clock pulses;

a presettable counter operative while the respective counter is enabled by an enabling signal to count in a predetermined direction and at a rate determined by successive clock pulses from any numerical value set therein to a value indicative of a count termination state;

means for setting the numerical value of one of said input signals into said counter responsively to a start pulse;

a variable modulo counter loaded with another of said input signals for providing a series of pulses, one upon each completion of that number of clock pulses corresponding to the numerical value of said other input signal;

divider means for providing a start pulse one out of every n of said pulses provided by said modulo counter; and means for providing an enabling signal to the first-named counter for a period of time corresponding to the quotient of the numerical value of said one signal divided by that of said other signal, thereby to generate a pair of binary signals representing the magnitude and sign, respectively, of a ternary analog output signal, the average value of which varies substantially linearly with the inverse of the numerical value represented by said other input signal.

* * * * *